(12) United States Patent
Chen et al.

(10) Patent No.: US 8,800,639 B2
(45) Date of Patent: Aug. 12, 2014

(54) HEAT DISSIPATION APPARATUS WITH HEAT PIPE

(75) Inventors: Chun-Chi Chen, New Taipei (TW); Xing-Hua He, Shenzhen (CN)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 358 days.

(21) Appl. No.: 13/271,162

(22) Filed: Oct. 11, 2011

(65) Prior Publication Data

US 2013/0048244 A1 Feb. 28, 2013

(30) Foreign Application Priority Data

Aug. 31, 2011 (CN) .......................... 2011 1 0254570

(51) Int. Cl.
*F28D 15/00* (2006.01)
*H05K 7/20* (2006.01)

(52) U.S. Cl.
USPC .................................... 165/80.3; 165/104.21

(58) Field of Classification Search
CPC  H01L 23/427; H01L 23/467; H05K 7/20663; F28F 2215/00; F28D 15/02
USPC ............ 165/80.3, 104.33, 79, 76, 67, 68, 69; 174/15.2, 16.3; 361/709, 703, 700; 257/715
See application file for complete search history.

(56) References Cited

U.S. PATENT DOCUMENTS

| | | | | |
|---|---|---|---|---|
| 1,634,110 | A * | 6/1927 | McIntyre ...................... | 165/182 |
| 2,089,340 | A * | 8/1937 | Cobb ............................ | 165/182 |
| 6,802,362 | B2 * | 10/2004 | Wenger et al. ........... | 165/104.33 |
| 7,011,144 | B2 * | 3/2006 | Zeighami et al. ........ | 165/104.21 |
| 7,661,466 | B2 * | 2/2010 | Li et al. .................... | 165/104.33 |
| 8,220,528 | B2 * | 7/2012 | Li et al. ........................ | 165/80.3 |
| 2003/0094273 | A1 * | 5/2003 | Toth et al. ..................... | 165/183 |
| 2006/0272799 | A1 * | 12/2006 | Hsu et al. ................. | 165/104.33 |
| 2008/0121372 | A1 * | 5/2008 | Zhou et al. ................... | 165/80.3 |

* cited by examiner

*Primary Examiner* — Tho V Duong
(74) *Attorney, Agent, or Firm* — Novak Druce Connolly Bove + Quigg LLP

(57) ABSTRACT

An exemplary heat dissipation apparatus includes a number of fins and a heat pipe. Each fin defines a through hole therein. A collar extends from each fin at an edge of the through hole. The collar inclines toward a center of the through hole. An inner diameter of the collar gradually decreases along a direction away form the fin. A diameter of the heat pipe is larger than a minimum inner diameter of the collar when the collar in a natural state. When the heat pipe extends through the through hole of the fin, the collar is pushed by the heat pipe to expand outwardly, so that the heat pipe intimately contacts an inner face of the collar.

8 Claims, 3 Drawing Sheets

HEAT DISSIPATION APPARATUS WITH HEAT PIPE

BACKGROUND

1. Technical Field

The present disclosure generally relates to heat dissipation apparatuses, and particularly to a heat dissipation apparatus having a heat pipe.

2. Description of Related Art

With developments in electronics technology, increased performance of electronic components such as CPUs (central processing units) has been achieved. However, such electronic components generate increased levels of heat, which must be dissipated promptly. Conventionally, a heat dissipation apparatus which includes a fin assembly combined with a heat pipe is used to remove the heat generated by the electronic component.

The fin assembly includes a number of fins. Each fin defines a through hole therein, for extension of the heat pipe. In order to ensure a high heat conductive efficiency between the heat pipe and the fins, typically, the heat pipe is soldered in the through holes of the fins by solder. However, solder is typically composed of a lot of heavy metals, such as lead, tin or others, which can cause permanent damage to humans or the environment.

Therefore, what is needed is a heat dissipation apparatus which can overcome the described limitations.

DETAILED DESCRIPTION

Figure 1:
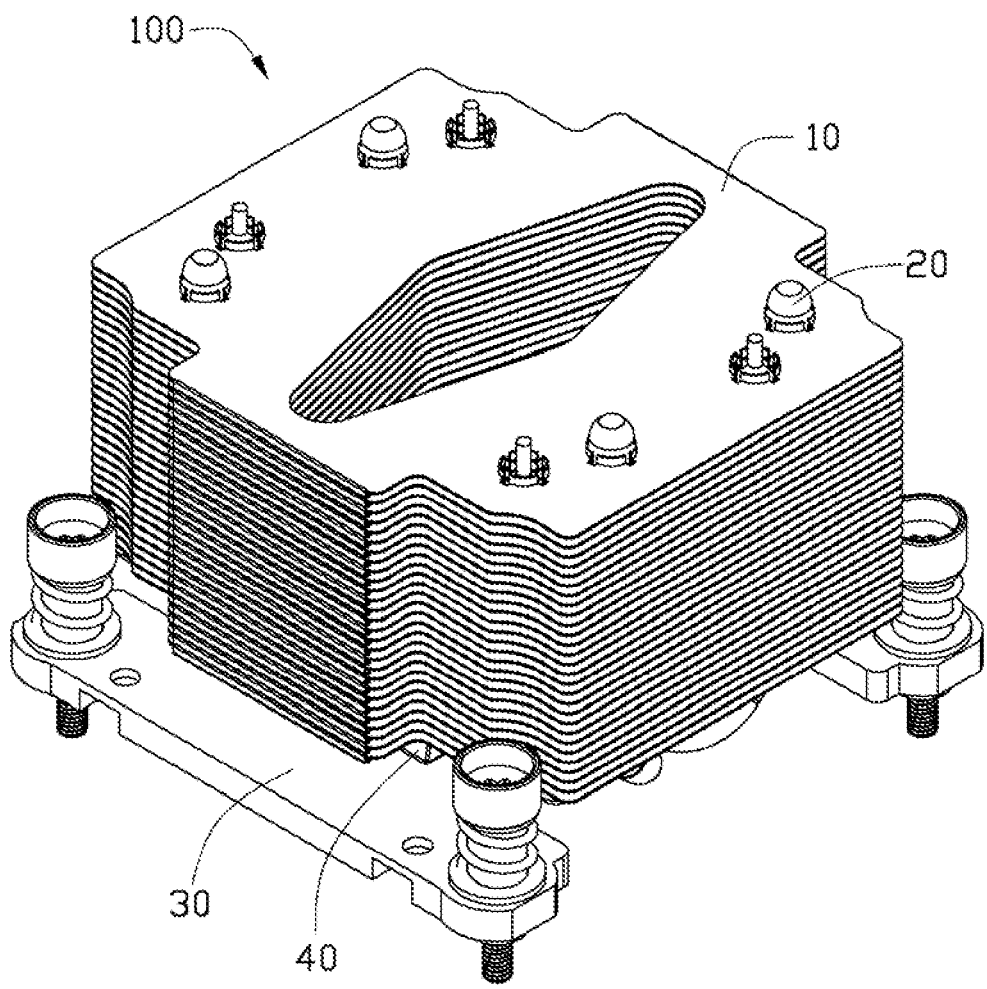
FIG. 1 is an isometric, assembled view of a heat dissipation apparatus in accordance with an exemplary embodiment of the present disclosure.
Figure 2:
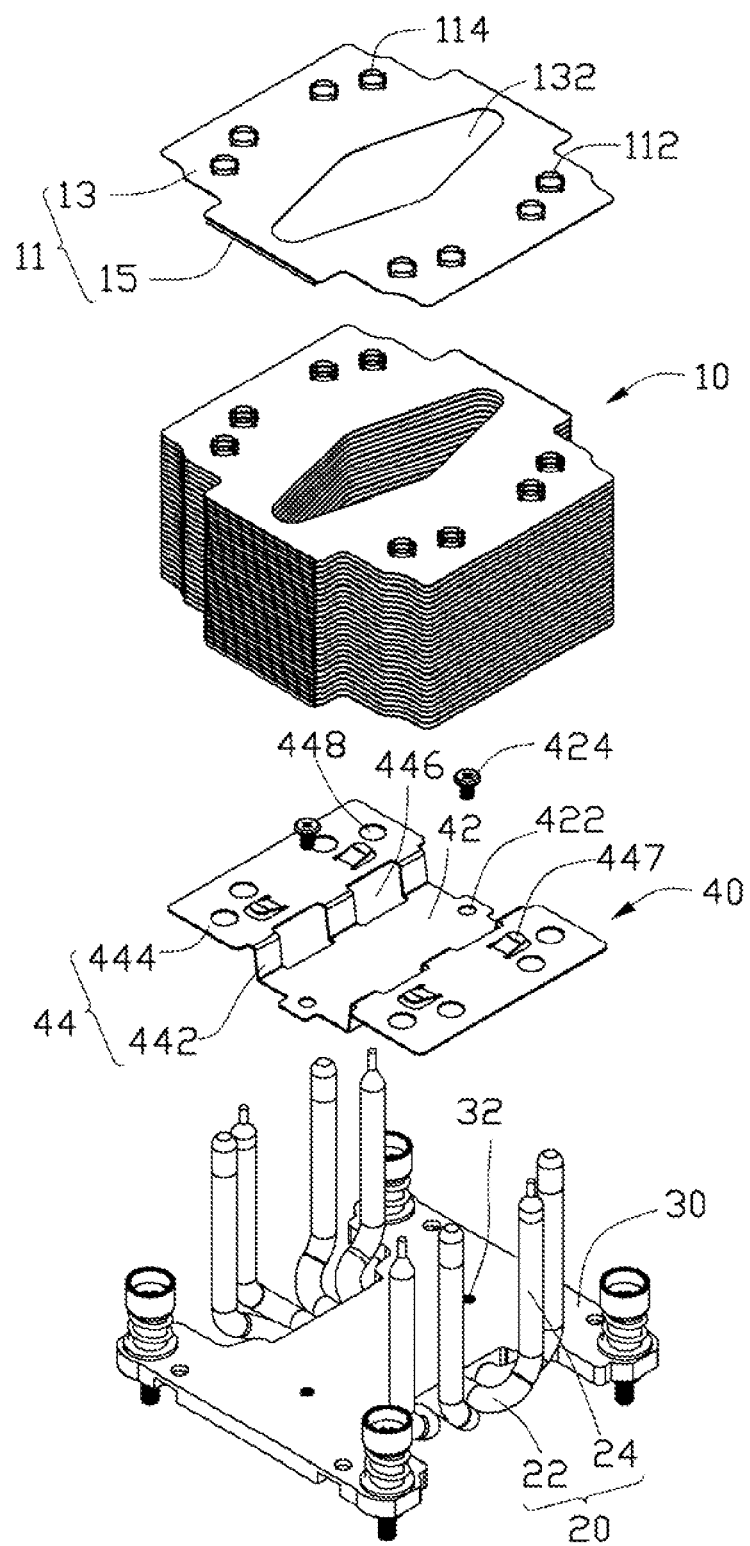
FIG. 2 is an exploded view of the heat dissipation apparatus of FIG. 1.

Referring to FIGS. 1-2, a heat dissipation apparatus 100 in accordance with an exemplary embodiment of the present disclosure is shown. The heat dissipation apparatus 100 includes a base 30, four heat pipes 20 fixed on and thermally contacting the base 30, a supporting bracket 40 mounted on the base 30, and a fin assembly 10 on the base 30.

Each heat pipe 20 includes a horizontal evaporating section 22 extending through the base 30, and two condensing sections 24 extending up from two ends of the evaporating section 22.

The supporting bracket 40 is located between the fin assembly 10 and the base 30. The supporting bracket 40 is at a bottom of the fin assembly 10 and thermally contacts the base 30. The supporting bracket 40 is formed by bending a metal plate and includes a connecting portion 42 thermally contacting the base 30, and two pressing portions 44. The pressing portions 44 extend perpendicularly up, and then horizontally and outwardly from two opposite sides of the connecting portion 42. Two through holes 422 are defined in two opposite ends of the connecting portion 42. The base 30 defines two fixing holes 32 therein corresponding to the through holes 422. Each pressing portion 44 includes an upright portion 442 connecting the connecting portion 42 and a horizontal portion 444. Each upright portion 442 defines two rectangular air holes 446 therein for airflow flowing through. Each horizontal portion 444 defines four circular through holes 448 therein. Two resilient sheets 447 extend slantwise and upwardly from each horizontal portion 444. Each through hole 448 has a diameter larger than or equal to a diameter of each heat pipe 20.

Figure 3:
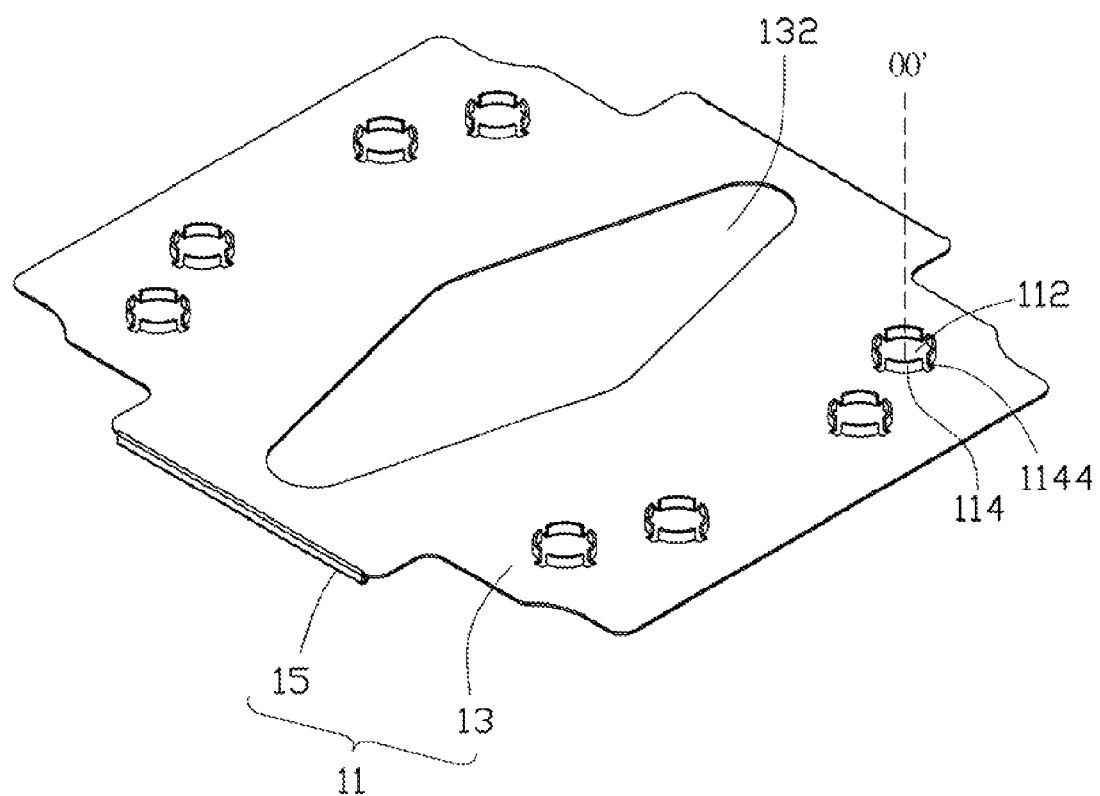
FIG. 3 is an enlarged view of a fin of the heat dissipation apparatus of FIG. 2.

Referring also to FIG. 3, the fin assembly 10 includes a number of metallic fins 11 stacked together. Each fin 11 includes a horizontal body 13, and two flanges 15 extending perpendicularly and downwardly from two opposite edges of the body 13 respectively. The flanges 15 of each fin 11 abut against a top face of the body 13 of an adjacent fin 11. The body 13 of each fin 11 defines an air hole 132 in a center thereof for airflow flowing through. The body 13 defines eight circular through holes 112 surrounding the through hole 132. An annular collar 114 extends slantwise and upwardly from each body 13 at an edge of each through hole 112. The collar 114 inclines toward a center of the through hole 112. That is, each collar 114 gradually approaches a central axis 00' of the through hole 112 along a direction far from the body 13 from which the collar 114 extends, so that an inner diameter of the collar 114 gradually decreases along a direction away from the body 13. When the collar 114 is in a natural state, the inner diameter at a distal end of the collar 114 is smaller than the diameter of the heat pipe 20, the diameter of the through hole 112 is larger than the diameter of the heat pipe 20. The fin 11 defines four slots 1144 at each collar 114. The four slots 1144 divide the collar 114 into four parts at a same interval. Each slot 1144 extends through the collar 114 from top to bottom and further extends to the body 13.

In assembly, the through holes 448 of the supporting bracket 40 are aligned with top ends of the condensing sections 24 of the heat pipes 20. The supporting bracket 40 is moved downwardly to make the heat pipes 20 extend through the through holes 448 of the supporting bracket 40 until the connecting portion 42 of the supporting bracket 40 contacts the base 30. Two screws 424 extend through the through holes 422 of the connecting portion 42 and engage in the fixing holes 32 of the base 30 to fix the supporting bracket 40 on the base 30. The through holes 112 of a fin 11 are aligned with top ends of the heat pipes 20. The fin 11 is moved downwardly to make the heat pipes 20 extend through the through holes 112 of the fin 11 until a bottom face of the body 13 of the fin 11 elastically contacts the resilient sheets 447 of the supporting bracket 40. All parts of the collars 114 are pushed by the heat pipes 20 to expand outwardly when the heat pipes 20 extend through the through holes 112, so that inner faces of the collars 114 intimately contact the heat pipes 20. Then the other fins 11 are sleeved on the heat pipes 20 according to the above method. Thus, all parts of the heat dissipation apparatus 100 are assembled together.

According to the present disclosure, when the heat pipes 20 extend through the through holes 112 of the fins 11, the collars 114 are pushed by the heat pipes 20 to expand outwardly, so that the heat pipes 20 are intimately mounted in the collars 114 of each fin 11 through an interference fit, there is no need to use solder with heavy metals.

It is to be understood, however, that even though numerous characteristics and advantages of the exemplary embodiments have been set forth in the foregoing description, together with details of the structures and functions of the embodiments, the disclosure is illustrative only; and that changes may be made in detail, especially in matters of shape, size, and arrangement of parts within the principles of the embodiments to the full extent indicated by the broad general meaning of the terms in which the appended claims are expressed.

What is claimed is:

1. A heat dissipation apparatus comprising:
a plurality of fins, each fin defining a through hole therein;
a collar extending from each fin at an edge of the through hole, the collar inclining toward a center of the through hole, an inner diameter of the collar gradually decreasing along a direction away form the fin form which the collar extends;
a heat pipe, a diameter of the heat pipe being larger than a minimum inner diameter of the collar when the collar in a natural state, when the heat pipe extends through the through hole of the fin, the collar being pushed by the heat pipe to expand outwardly, so that the heat pipe intimately contacting an inner face of the collar; and
a supporting bracket located at a bottom of the fins, the supporting bracket defining a through hole, the heat pipe extending through the through hole of the supporting bracket;
wherein the supporting bracket is formed by bending a metal plate and comprises a connecting portion, and a pressing portion extending upwardly then outwardly from a side of the connecting portion, the through hole of the supporting bracket is defined in the pressing portion; and
wherein the pressing portion comprises an upright portion connecting the connecting portion and a horizontal portion, the upright portion defining an air hole therein for airflow flowing through, a resilient sheet extending slantwise and upwardly from the horizontal portion, one of the fins elastically contacting the resilient sheet.

2. The heat dissipation apparatus of claim 1, wherein the diameter of the through hole is not less than the diameter of the heat pipe.

3. The heat dissipation apparatus of claim 1, wherein each fin defines a plurality of slots in each collar, the slots dividing the collar into a plurality of parts at a same interval.

4. The heat dissipation apparatus of claim 3, wherein each slot extends through the collar along a central axis of the through hole of the fin.

5. The heat dissipation apparatus of claim 1, wherein the through hole of the supporting bracket has a diameter larger or equal to the diameter of the heat pipe.

6. The heat dissipation apparatus of claim 1, wherein two flanges extending downwardly from two opposite edges of each fin, the flanges of each fin abutting against a top face of an adjacent fin.

7. The heat dissipation apparatus of claim 1, wherein each fin defines an air hole in a center thereof for airflow flowing through.

8. The heat dissipation apparatus of claim 1, further comprising a base located at a bottom of the supporting bracket, the connecting portion of the supporting bracket thermally contacting the base, a bottom end of the heat pipe thermally contacting the base.

* * * * *